(12) United States Patent
Rajendra

(10) Patent No.: US 10,763,034 B2
(45) Date of Patent: Sep. 1, 2020

(54) COMPACT PULSE TRANSFORMER WITH TRANSMISSION LINE EMBODIMENT

(71) Applicant: Secretary, Department of Atomic Energy, Mumbai (IN)

(72) Inventor: Kumar Rajawat Rajendra, Visakhapatnam (IN)

(73) Assignee: Secretary, Department of Atomic Energy, Mumbai (IN)

( * ) Notice: Subject to any disclaimer, the term of this patent is extended or adjusted under 35 U.S.C. 154(b) by 888 days.

(21) Appl. No.: 15/301,802

(22) PCT Filed: Jun. 13, 2014

(86) PCT No.: PCT/IN2014/000396
§ 371 (c)(1),
(2) Date: Oct. 4, 2016

(87) PCT Pub. No.: WO2015/155783
PCT Pub. Date: Oct. 15, 2015

(65) Prior Publication Data
US 2017/0117089 A1    Apr. 27, 2017

(30) Foreign Application Priority Data

Apr. 7, 2014    (IN) .......................... 1295/MUM/2014

(51) Int. Cl.
*H01F 27/30*     (2006.01)
*H01F 27/28*     (2006.01)
*H01F 30/08*     (2006.01)
*H03K 3/537*     (2006.01)
*H03B 11/02*     (2006.01)
*H01F 27/02*     (2006.01)
*H01F 27/29*     (2006.01)
*H01F 27/32*     (2006.01)
*H01F 5/00*      (2006.01)

(52) U.S. Cl.
CPC .......... *H01F 27/2823* (2013.01); *H01F 27/02* (2013.01); *H01F 27/29* (2013.01); *H01F 27/324* (2013.01); *H01F 30/08* (2013.01); *H03B 11/02* (2013.01); *H03K 3/537* (2013.01); *H01F 2005/006* (2013.01)

(58) Field of Classification Search
CPC . H01F 2005/006; H01F 27/02; H01F 27/2823
USPC ......................................... 336/90
See application file for complete search history.

(56) References Cited

U.S. PATENT DOCUMENTS 2,963,669 A    12/1960    Salisbury
3,327,253 A     6/1967    Campbell
(Continued)

*Primary Examiner* — Ronald Hinson
(74) *Attorney, Agent, or Firm* — The Webb Law Firm

(57) ABSTRACT

An arrangement of coaxial windings is provided. The arrangement includes primary and secondary windings as air-core pulse transformers having insulation and winding arrangement for efficient energy transfer to the secondary winding. The secondary winding is wound with a central metallic core to include a coaxial transmission line with it and is configured to deliver a rectangular pulse across its terminals. The arrangement also includes a coaxial feeding arrangement for the primary winding with a central coaxial terminal connecting to one end of an adjustable primary closing switch electrode so as to have variable voltage feed input corresponding to its load requirement.

11 Claims, 6 Drawing Sheets

(56) References Cited

U.S. PATENT DOCUMENTS

Figure 1A:
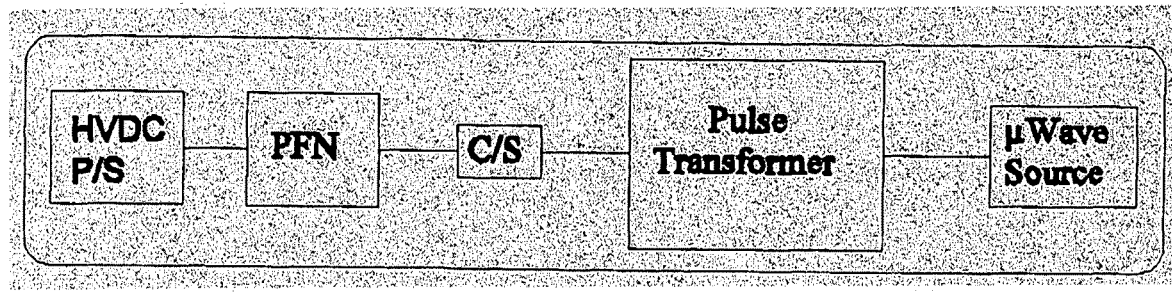

| | | | |
|---|---|---|---|
| 7,239,224 B2 * | 7/2007 | Wada | H01F 38/12 |
| | | | 336/198 |
| 7,733,208 B2 | 6/2010 | Wolfgram | |
| 2012/0081202 A1 | 4/2012 | Nanayakkara et al. | |

* cited by examiner

COMPACT PULSE TRANSFORMER WITH TRANSMISSION LINE EMBODIMENT

CROSS-REFERENCE TO RELATED APPLICATIONS

This application is the United States national phase of International Application No. PCT/IN2014/000396 filed Jun. 13, 2014, and claims priority to Indian Patent Application No. 1295/MUM/2014 filed Apr. 7, 2014, the disclosures of which are hereby incorporated in their entirety by reference.

FIELD OF THE INVENTION

The present invention relates to a compact and portable pulse transformer applicable to airborne and strategic pulsed power systems.

BACKGROUND OF THE INVENTION

Pulse transformer is employed as device to raise the secondary voltage/impedance for a PFN driven modulator for Klystron/Magnetron acting as microwave sources for LINAC/RADAR.

Co-axial transmission lines are employed not only as carrier for communication signals, but also in pulse power systems as modulator for generating high power rectangular pulses.

Transmission line transformers are employed to transmit energy from primary to secondary in transmission line mode and not in flux-linkage mode as is usual for pulse transformers, and are thus employed in matching the impedance levels of signals at input and output, as in 'BALUN' (Balanced to unbalanced), and for high frequency applications. The two windings are actually transmission lines (Coax or balanced two wire line) to start with. They are configured to offer very high common-mode impedance and invariably constitute magnetic materials, to achieve this feature.

Requirements exist to generate fast rise-time, near flat-top rectangular pulses in Pulsed Power Technology, Modulators for RF and Microwave sources in Linear Accelerators (LINAC) and RADAR applications to drive, generally pulsed electron beam loads. These are of importance to generate mono-energetic electron beam—because of flat-top characteristics of voltage pulse; having applications in Flash X-ray (FXR), High Power Mircrowave (HPM) and Linear Accelerators (LINAC). Direct excitation of high voltage step and short rectangular pulse is required to excite antennas of Ultra Wide Band (UWB) Systems and the ranging and detection applications in RADAR technology.

The prior art device although mostly meet the general applications of commercial and R&D pulsed power laboratory requirements but, the need for making pulsed power systems more compact and portable as in the case of airborne and other strategic systems, more compact pulse power systems are required. Conventional system adds to linear dimensions being larger and incidental increase in weight.

It is therefore an object of the invention to propose a compact and portable pulse transformer applicable airborne strategic system.

SUMMARY OF THE INVENTION

This invention teaches a compact pulse power system for airborne systems and areas where space and weight constraints exist. The invention involves implementation of transmission line within the confines of the pulse transformer winding so as to give the required fast rise time, near flat-top rectangular pulse at the load end. Elements of the invention afeinclude the winding scheme adopted with a non-magnetic metallic core, an insulation scheme for good coupling factor in case of an air-core high voltage scheme and primary and secondary closing switches to initiate the pulse input and achieve a fast rise-time pulse at the secondary output at the start of the discharge for a duration dependent on the transmit time of the transmission line. This combination of two normally independent components in a pulse power system, in single element, has significance in applications relating to pulse power technology of accelerators and airborne applications.

According to one embodiment of this invention, there is implemented an innovative design of the transformer winding to accommodate the Transmission Line form within the Pulse Transformer winding, thereby reducing the system size corresponding to linear dimensions of the Transmission Line which is otherwise connected external to the transformer. This arrangement significantly reduces the size-specifically the linear dimension and weight of the pulse power system. Another embodiment of this invention is implementation of a high voltage closing switch at the secondary winding for fast rise time implementation of the output waveform. An important aspect of the invention is that a simple oscillatory capacitor/capacitor bank discharge through a closing switch, without any special pulse conditioning, is required at the primary end to generate rectangular pulse a the secondary winding output during the pulsed discharge.

From a simple oscillatory capacitor bank discharge in the primary winding of the compact pulse transformer, a 120 kV, <5 nanosecond rise-time pulse of 150 nanosecond pulse width can be generated using the disclosed embodiments of the invention. The pulse width is a design requirement and the transformer may be wound using the principles of co-axial transmission lines to accomplish the required pulse width.

In another embodiment of the invention, pulse polarity is selectable by changing the primary closing switch's gap setting. The pulse polarity in yet another embodiment is also tunable, positive or negative, by tuning the secondary spark-gap breakdown voltage either through gap adjustment—practically difficult in the current embodiment, but more readily by changing the spark-gap gas dielectric pressure within the switching volume.

The present invention is directed to a device that comprises the following:

a. A Primary Winding co-axially arranged (conventionally in sheet form) with the central core 1 (e.g., a central metallic core), primarily connected to the two-end feed terminals.

b. A Secondary Winding, co-axially arranged with the central core.

c. Insulation 4 (e.g., dielectric insulation) of primary with the external cylindrical transformer body.

d. Insulation 3 (e.g., solid dielectric insulation) between primary and secondary winding for required voltage isolation.

e. Insulation 2 (e.g., solid dielectric insulation) between secondary winding and the central metallic core 1.

f. Non-magnetic nature of central core 1, thereby, transformer essentially being termed as air-core transformer.

g. A primary excitation scheme similar to a Tesla transformer scheme, comprising of a capacitor/capacitor bank.

h. A secondary having a self breakdown closing switch in spark-gap embodiment.

The device may further comprise the following:
(a) A single layer coaxial to central cylindrical core, few turns primary winding comprising of multi-conductors—to carry large primary current, insulated from each another, scheme having one end of the primary terminal distributed on the external metallic cylindrical body in a helical spread around the circumference and the other terminal on an inner return conductor with multi-conductor termination distributed again in a helical spread around the circumference.
(b) The primary is fed through a coaxial capacitor bank which powers the primary through a series closing gap (spark-gap switch) working in self breakdown mode. The other end of the primary connects to the primary spark-gap electrode through a central shaft on the axis of the transformer body.
(c) A single layer multi-turn Secondary winding, having one of its terminals as a common reference potential point on the external metallic cylinder-common with the primary winding, and the other connecting to the central non-magnetic, conical, axially slit metallic shaft 9.
(d) Thin conducting adhesive tapes covering the slit portion of the conical hollow metal shaft.
(e) The conical hollow metallic shaft on the transformer axis, having thin metallic tapes covering the slit portion comprises of the important difference, as this constitutes of the central conductor of the coaxial line formed with the helically co-axial wound secondary winding. Important aspect of the metallic core design is that it should permit efficient flux coupling between the winding with minimal eddy-current losses, at the same time, during the discharge cycle, provides the continuous central conductor for the transmission line discharge. The transmission line is the embodiment of secondary winding with this metallic central conductor/shaft. An arrangement similar to this for the transmission line is employed in delay line, which has either one of the windings wound in helical form, leading to longer transit time delays of electrical signal.
(f) The central conductor/shaft in conjunction with the outer metallic cylindrical body comprises of the two terminals of the secondary winding across which required high voltage is generated in accordance with the Faraday's law of induction as in the case of conventional transformer. But the same terminals terminate as the coaxial transmission line conductors.
(g) The dimensioning of the secondary winding and the central shaft is done in accordance with the co-axial transmission line design after accounting for the necessary high voltage insulation levels, power handling, pulse duration and load impedance requirement.

A complementary conically tapered insulation stacking scheme between primary, secondary windings and the central conical metallic core, is adopted to accomplish optimum high voltage withstand and flux coupling requirements, thereby good coefficient of coupling for air-core transformer, between the two windings.

BRIEF DESCRIPTION OF THE ACCOMPANYING DRAWINGS

FIG. 1(a) illustrates, through Block diagram schematic, the functional aspect and the sequential arrangements of components in a Pulse Power System, including an arrangement for LINAC and Radar applications.

Figure 1B:
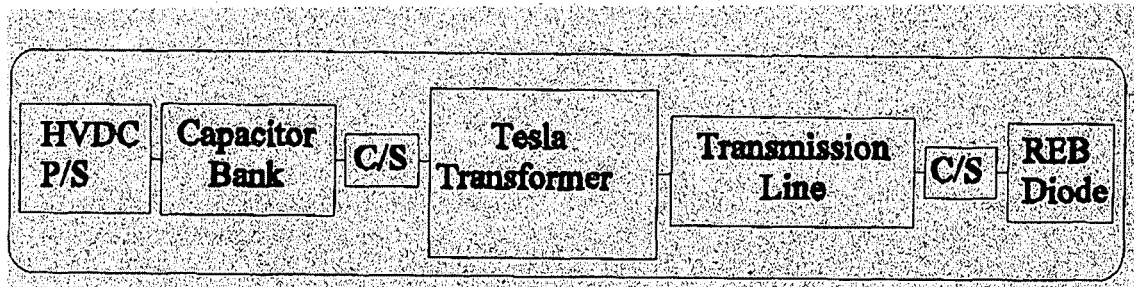

FIG. 1(b) -illustrates a Block diagram schematic of the Pulse Power System, including an arrangement for FXR and HPM applications.

Figure 2:
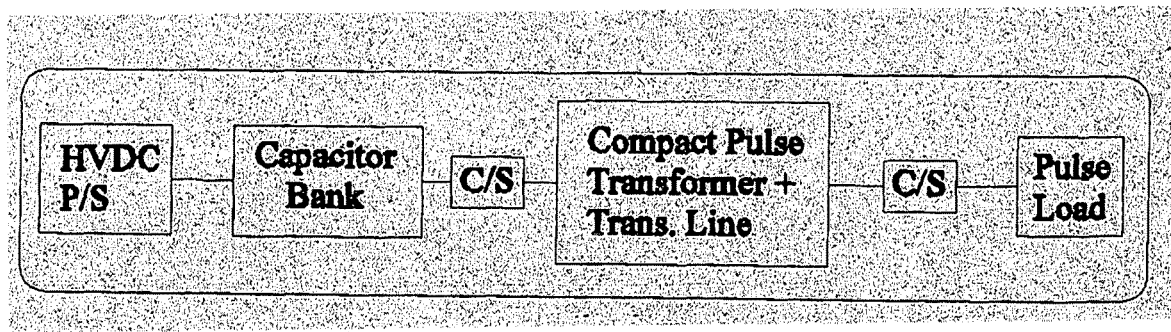

FIG. 2—illustrates how the embodiment of line within the pulse transformer will transform the pulse power schematic.

Figure 3:
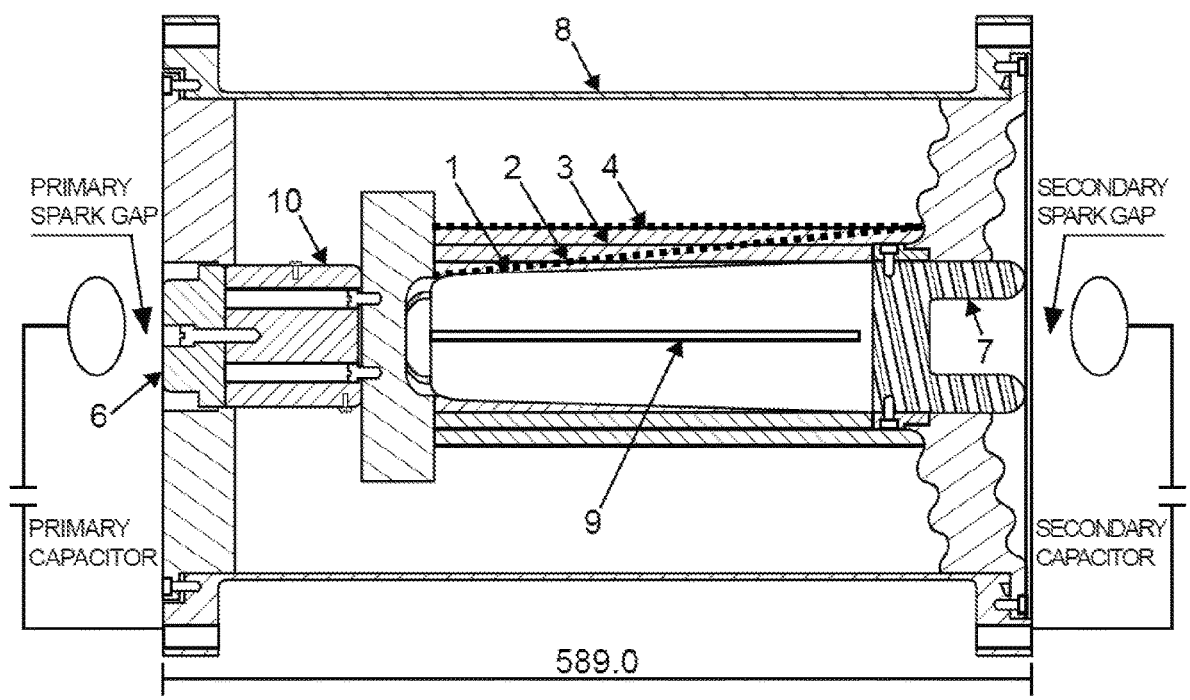

FIG. 3—Shows the sectional view of the invention—a half section of Compact Pulse Transformer with all the necessary embodiments and circuit connections at the input and the output ends with enumerative description of all the constituent elements.

Figure 4:
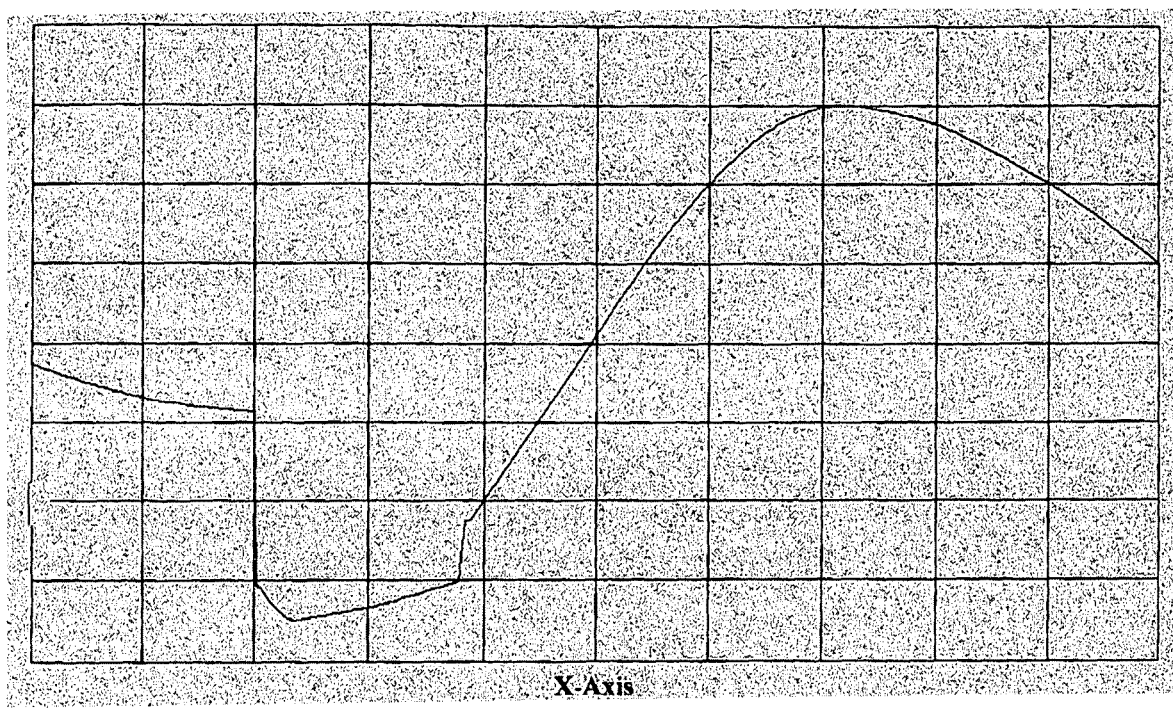

FIG. 4—shows a typical waveform at the secondary output of the Compact Pulse Transformer.

Figure 5:
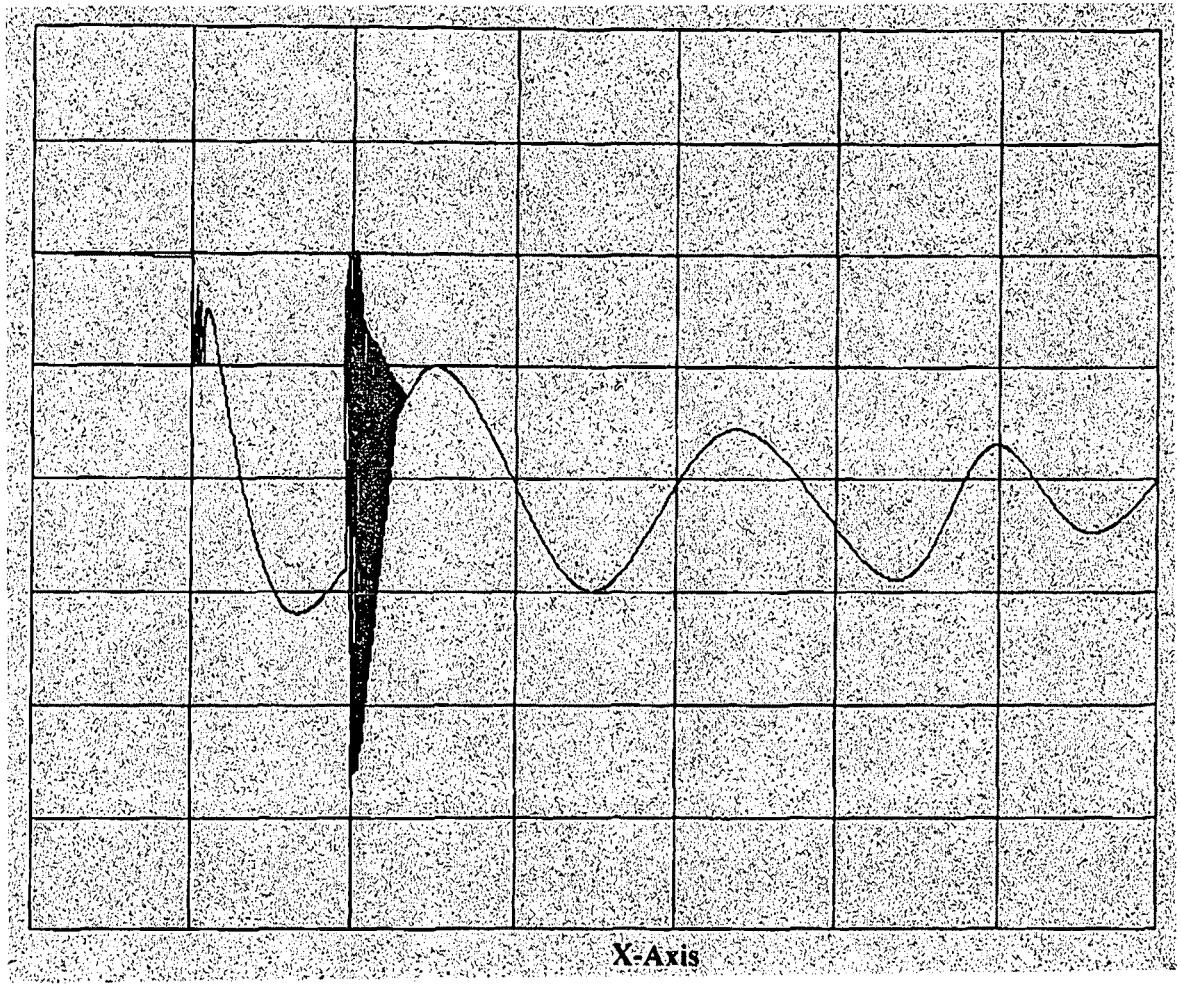

FIG. 5—shows the input waveform of the capacitor bank discharge, after the primary end closing switch is operated.

Figure 6:
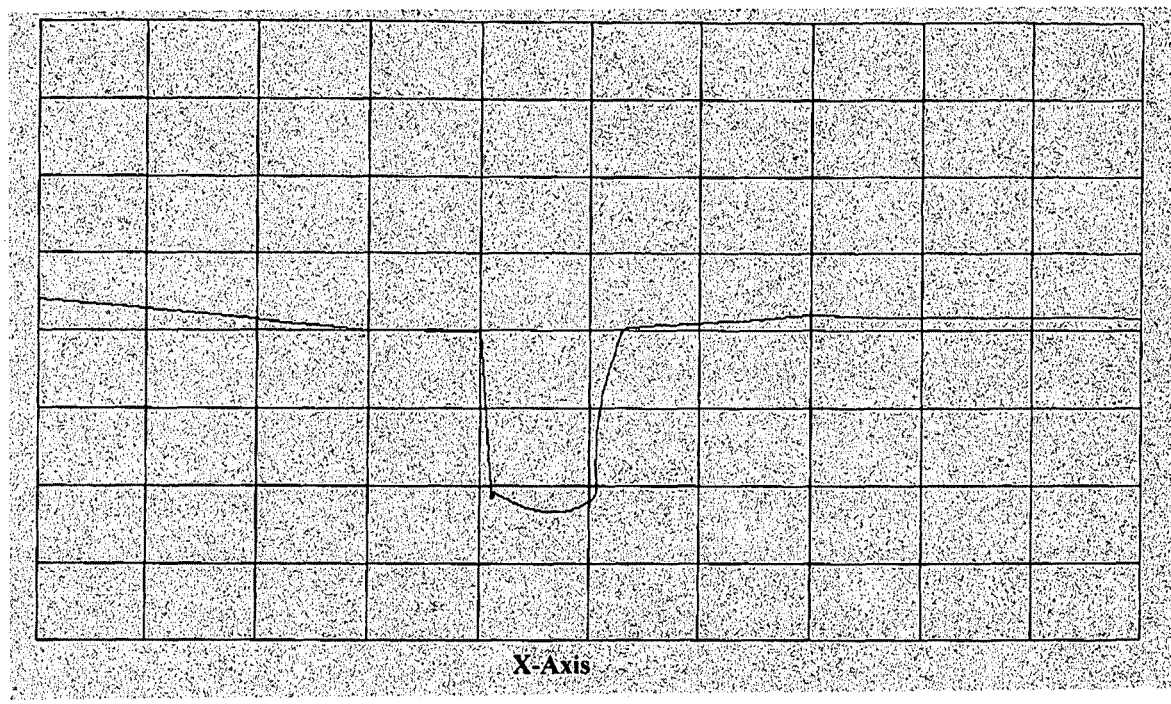
Figure 6:
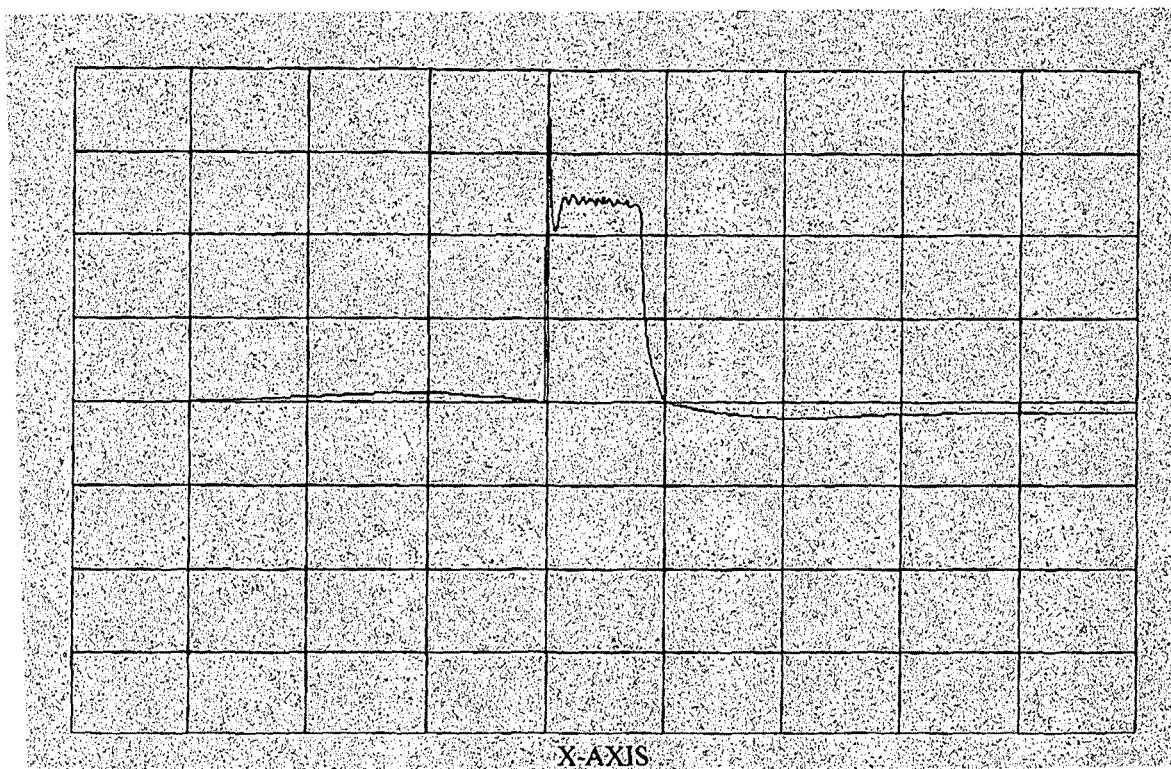

FIG. 6(a,b)—shows the two different polarities (FIG. 6(a) showing negative polarity pulse and FIG. 6(b) showing positive polarity pulse) of waveforms achieved by tuning of the primary closing switch and/or changing the charging voltage of the capacitor bank.

DETAIL DESCRIPTION OF THE INVENTION

Constructional Steps of the Device
(i) Sectional details show a central core 1 (e.g., a central shaft), made up of non-magnetic stainless steel (SS) with taper in 1:20, having an axial length of 250 mm for the winding. In some non-limiting embodiments or aspects, the central core 1 may have a diameter of 75 mm at one end and 100 mm at the other end. In some non-limiting embodiments or aspects, the central core 1 may also have 6 mm wide axial slits, 4 nos., at 90° intervals, all around the central core 1.
(ii) Shaft is vertically fixed at one end, the right side in the section shown, to a flange by thread screwing circumferentially on the shaft.
(iii) The assembly of step (ii), in turn is attached to the flange end of the metal cylinder 8 (e.g., an external SS cylindrical body), again in vertical position, and the SS flanged end is made the base reference for all the following steps.
(iv) The central core 1 (e.g., a SS shaft) is cleaned by Acetone to remove any dust and grease. The slits are then covered by <0.3 mm thick, 25 mm wide Aluminium/Copper adhesive tapes, all along the length of the shaft.
(v) Shaft is the laid with the insulation 2 (e.g., secondary insulation) that is put in stepped manner with reducing axial length from 250 mm at the start to 50 mm at the end. Each set comprises of 3 mil thick Mylar sheet with twelve layers-cut to size of a corresponding circles sector for a non-crimpled tapered cylindrical layering. Thus, for a 25 mm thick maximum tapered portion, about 33 such layered sets are put. Mylar insulation is secured in place by 50 mm wide room temperature vulcanized (RTV) taped wound on top of the finished Mylar layer with 50% overlap. This makes the insulation 2 complete.
(vi) Single layer secondary winding, comprising of 100 turns of 1.2 mm diameter silver plated copper, double layer Teflon insulated EE grade wire, is then laid on top of the finished insulation of step (v). The continuous conductor length required to wind the secondary is approximately of 45 meters. This covers an axial helically wound length of 250 mm on the insulated central SS shaft. Secondary winding is terminated with one end at the central shaft-having minimum side of the insulation, and the other end on the external SS cylinder forming the common terminal with the primary winding.

(vii) After securing the secondary winding, a layer of RTV tape is put again. There after, as reported in step (v), insulation (3) between secondary and primary windings is built in a complementary fashion, to finally have a cylindrically finished top layer with maximum thickness of 25 mm.

(viii) Mylar layer is again secured in place by RTV tape laid as reported in step (v).

(ix) Primary winding, comprising of 36 numbers of the same conductor as reported in step (vi), but the cut length of only 1.5 m length. All the conductors are first terminated on the outer SS housing (constituting of two cylinders threaded to each other and formed in two parts to help during winding) of the transformer in a helical fashion. The given length permits only three turns to this multi-conductor primary winding to be put covering the entire secondary winding's axial length of 250 mm to ensure even coupling. The other ends (36 numbers) of the primary winding are terminated on an adapter 10 (e.g., a central SS adapted) threaded to part number 6 and supported by block separating the central SS shaft and this adapter 10, as shown in FIG. 3. The block also has notches to help secure the primary winding conductors through them before their termination on the adapter 10.

(x) 1 mil thick tape of 50 mm width is finally laid on top of the insulation 4 (e.g., the primary insulation) with care being taken to minimize the wrinkling during the winding. Winding is now ready for subsequent RTV potting (if required) but the transformer now has sufficient insulation to be tested for at least 250 kV insulation level.

(xi) The second cylinder, as reported in (ix), as two part constituent of the stainless steel cylindrical body 8 (e.g., the external SS cylindrical housing), is now threaded on the first as to enclose the completed winding in the external housing. Delrin® end flange is now secured to the central shaft and the external housing with neoprene gasket to help absorb shocks and vibrations.

(xii) The assembly is now ready for testing the transformers electrical parameters, viz., (i) Primary inductance, (ii) Secondary inductance (iii) mutual inductance, and (iv) corresponding winding capacitances, etc., (iii) How does the device operate?

Device operation is in similar manner as a pulse transformer with any pulse power system. Electrically, it is a passive device and has to be powered to exploit its functional features—that of a transformer and that of the transmission line, in this invention. Primary stored energy of a capacitor bank is discharged in the low inductance primary of the transformer through an adjustable primary closing switch electrode 6 (e.g., a self breakdown primary switch). This generate sufficient high rate of rise large flux density, to induce across the secondary winding very large transient voltage. The secondary side closing switch 7, set to break at the required output voltage through a preset gap setting or through the pressure adjustment of the gap-switch; thereby couples the primary energy to the load impedance. The extent of match/mismatch decides the net power transferred to the load. This matching extent, in the reported invention, is decided by the transmission line characteristic impedance embodiment within the transformer winding and the extent of this impedance match with the load. Device may be operated in single shot or repetitive manner. It is tested at 3 Hz for five minutes duration, with no adverse performance deterioration, giving a tested life shots of about 1000, without failure.

A few typical examples to illustrate how the invention is carried out in actual practice:

In one of the applications, typical requirement was to generate high voltage from a low impedance (<1 ohm), high current source (>500 kA). As the system is finally required to power high impedance load (>10 Ohm) with the purpose of generating high power microwaves, need for a high voltage pulse transformer became imperative. Typically, to drive an REB (Relativistic Electron Beam) Diode, pulse generator has to give a fast rise-time (<10 ns) flat-top pulse of about 100 ns pulse wide. This requirement indicates employment of transmission line or an equivalent network. Direct embodiment of very high voltage coaxial transmission line by using high power co-axial cables, is a possible solution, but was found to be cumbersome. Incidentally, the embodiment required coaxial flow of return currents and hence the need for a central return conductor was imperative. The idea to employ this central conductor within the pulse transformer core and multi-turn secondary windings configuration, intuitively suggested the topology of a delay line. The limitation was the central conductor which would generate large eddy currents and associated losses, thereby significantly reducing the available power at the load. The solution to this problem was to design the central conductor, in a fashion, as to permit relatively low frequency flux coupling during the primary winding excitation. This was made possible by axially slitting 9 the central core 1 and covering these slits by thin conducting tapes. This incorporation permitted diffusion of the slower rise-time primary excitation and yet permitted conductor continuity for transmission line modes for fast rise-time output discharge.

Main advantages of the invention are the following:

(i) A compact embodiment comprising of pulse transformer and a transmission line features in one element, thereby significant reduction of linear dimensions of the pulse power system. This size reduction, and incidental reduction of weight, will be significant for airborne and portable pulse power systems and significantly adds to the commercial and strategic value of the system.

(ii) An embodiment of tapered insulation system in a co-axial configuration, giving optimum high voltage withstand capacity and ensures good transformer coupling. The graded nature of the insulation scheme adopted will help transformer industry for better implementation of the insulation requirement of pulse transformer.

I claim:

1. An arrangement of coaxial windings comprising:

a primary winding and a secondary winding as air-core pulse transformers having an insulation and winding arrangement for efficient energy transfer to the secondary winding, the secondary winding being wound with a central metallic core to include a coaxial transmission line and configured to deliver a rectangular pulse across its terminals, wherein the central metallic core comprises a non-magnetic material; and a coaxial feeding arrangement for the primary winding with a central coaxial terminal connecting to one end of an adjustable primary closing switch electrode so as to have variable voltage feed input corresponding to a load requirement, wherein a plurality of conductors of even length and insulated from one another but arranged in parallel to form two multi-conductor end terminals wound coaxially with single or many turns and terminated at one end in helical fashion on a metal cylinder comprising an outer housing and the other terminal terminated helically across central return conductor.

2. The arrangement of coaxial windings as claimed in claim 1, wherein the insulation comprises a plurality of insulation sheets positioned between the primary winding and the secondary winding and wherein the central metallic core is positioned on a tapered cylinder-metallic core in stepped relation, and wherein the plurality of insulation sheets covers without wrinkles the central metallic core in many layers with sufficient axial overlapped and axial length decreasing/increasing, as to give a needed insulation requirement of a transformer winding when voltage builds along its winding length.

3. The arrangement of coaxial windings as claimed in claim 1, wherein sufficient electrical isolation/insulation between the central metallic core and the outer housing are made through dielectric end-supports made of Acetal Homopolymer block machined to size and fixed circumferentially at its two ends.

4. The arrangement of coaxial windings as claimed in claim 1, wherein a total parallel conductor requirement is generated to provide complete coaxial coverage to the secondary winding to achieve a needed coupling coefficient in one of the air-core pulse transformers.

5. The arrangement of coaxial windings as claimed in claim 4, wherein two cylindrical parts are axially connected to form electrical continuity, but mechanically separable to ensure ease in winding.

6. The arrangement of coaxial windings as claimed in claim 1, comprising a multi-turn single layer secondary winding wound to achieve a desired turns ratio as the air-core transformer and required pulse width as transmission line formed with the central metallic core of constant impedance, as required by the load requirement.

7. The arrangement of coaxial windings as claimed in claim 6, wherein the secondary winding has a common termination with the primary winding at an external cylindrical core and the other terminal is connected to the central metallic core forming a high voltage end of an output along its central axis.

8. The arrangement of coaxial windings as claimed in claim 7, wherein the closing switch electrode has a toroidal end-section of the high voltage end of the closing switch electrode, and is in a housing with pressurization of a high-voltage spark-gap as the closing switch.

9. The arrangement of coaxial windings as claimed in claim 7, wherein the central metallic core comprises an axially slit cylinder to permit interaction of magnetic flux generated by the primary winding with the secondary winding without inducing eddy-currents.

10. The arrangement of coaxial windings as claimed in claim 9, wherein the axial slits of the central metallic core are covered by thin conducting adhesive tapes to ensure that a thickness of the adhesive tape is sufficient to permit diffusion of a relatively slowly time varying primary winding flux ensuring good coupling through a central axis of the windings and ensuring a central conductor's circumferential continuity so as to form a central axis conductor of the transmission line during a start of a fast rise-time energy discharge cycle with a closing of a secondary side spark-gap switch.

11. The arrangement of coaxial windings as claimed in claim 10, wherein resistive or/and thin continuous metal cylinders are employed as a central core without axial slitting.

* * * * *